United States Patent
Oda et al.

(10) Patent No.: US 9,431,560 B2
(45) Date of Patent: Aug. 30, 2016

(54) POLYVINYL ACETAL RESIN FILM AND MULTILAYER STRUCTURE ARTICLES USING THE SAME

(75) Inventors: Hidemasa Oda, Tokyo (JP); Takashi Mukose, Kurashiki (JP); Makio Tokoh, Tokyo (JP)

(73) Assignee: KURARAY CO., LTD., Kurashiki-shi (JP)

( * ) Notice: Subject to any disclaimer, the term of this patent is extended or adjusted under 35 U.S.C. 154(b) by 512 days.

(21) Appl. No.: 14/008,745

(22) PCT Filed: Mar. 29, 2012

(86) PCT No.: PCT/JP2012/058406
§ 371 (c)(1),
(2), (4) Date: Sep. 30, 2013

(87) PCT Pub. No.: WO2012/133668
PCT Pub. Date: Oct. 4, 2012

(65) Prior Publication Data
US 2014/0020759 A1    Jan. 23, 2014

(30) Foreign Application Priority Data
Mar. 29, 2011   (JP) .................................. 2011-072090

(51) Int. Cl.
*H01L 31/048*    (2014.01)
*B32B 17/10*    (2006.01)
(Continued)

(52) U.S. Cl.
CPC ..... *H01L 31/0481* (2013.01); *B32B 17/10761* (2013.01); *B29C 47/0021* (2013.01);
(Continued)

(58) Field of Classification Search
None
See application file for complete search history.

(56) References Cited

U.S. PATENT DOCUMENTS 4,575,540 A * 3/1986 Cartier ............... B29C 47/0004
525/328.2
6,383,647 B1   5/2002 Shohi et al.
(Continued)

FOREIGN PATENT DOCUMENTS

EP    1 036 775 A1    9/2000
JP    48 51964    7/1973
(Continued)

OTHER PUBLICATIONS

Extended Search Report issued Aug. 6, 2014 in European Patent Application No. 12763997.9.
(Continued)

*Primary Examiner* — Robert S Loewe
(74) *Attorney, Agent, or Firm* — Oblon, McClelland, Maier & Neustadt, L.L.P

(57) ABSTRACT

An object of the present invention is to provide a film that is used as one layer of a multilayer structure articles such as a laminated glass, and a solar cell module, and prevents the intrusion of bubbles and the generation of unfilled portions at the edge portions of the film; and a multilayer structure articles obtained with the use of the film. A polyvinyl acetal resin film, having a thickness distribution in the width direction of 10% or less, and a volatile matter content of 1.0 mass % or less, in which as to a portion of 5% of the total width inside from each of both edges in the width direction, when each portion is heated at 150° C. for 30 minutes, the larger value of the heat shrinkage in the flow direction that is parallel to the film and perpendicular to the width direction is referred to as heat shrinkage MD1, and the other value is referred to as heat shrinkage MD2, and when central portion in the width direction of the film is heated at 150° C. for 30 minutes, the heat shrinkage in the flow direction that is parallel to the film and perpendicular to the width direction is referred to as heat shrinkage MD3, all the heat shrinkage MD1, heat shrinkage MD2, and heat shrinkage MD3 are 3 to 20%.

14 Claims, 4 Drawing Sheets

(51) Int. Cl.
  *B29C 47/88*   (2006.01)
  *B29C 47/92*   (2006.01)
  *C08J 5/18*    (2006.01)
  *B29C 47/00*   (2006.01)

(52) U.S. Cl.
  CPC ............ *B29C47/0064* (2013.01); *B29C 47/88* (2013.01); *B29C 47/92* (2013.01); *B29C 2947/922* (2013.01); *B29C 2947/9298* (2013.01); *B29C 2947/92171* (2013.01); *B29C 2947/92209* (2013.01); *B29C 2947/92428* (2013.01); *B29C 2947/92485* (2013.01); *B29C 2947/92647* (2013.01); *B29C 2947/92666* (2013.01); *B29C 2947/92695* (2013.01); *B29C 2947/92704* (2013.01); *B29C 2947/92923* (2013.01); *C08J 5/18* (2013.01); *C08J 2329/04* (2013.01); *Y02E 10/50* (2013.01); *Y10T 428/24479* (2015.01); *Y10T 428/3163* (2015.04)

(56) References Cited

U.S. PATENT DOCUMENTS

| | | |
|---|---|---|
| 2002/0136906 A1† | 9/2002 | Schohi |
| 2006/0183833 A1 | 8/2006 | Wong et al. |
| 2006/0263608 A1* | 11/2006 | Choi ................ B32B 17/10577 428/426 |
| 2007/0196629 A1* | 8/2007 | Smith .................... B32B 17/10 428/195.1 |
| 2008/0286542 A1* | 11/2008 | Hayes .................... B32B 17/10 428/213 |
| 2009/0274898 A1* | 11/2009 | Kondou .................... C08J 5/18 428/336 |
| 2010/0275980 A1 | 11/2010 | Karpinski et al. |

FOREIGN PATENT DOCUMENTS

| | | |
|---|---|---|
| JP | 60 21834 | 2/1985 |
| JP | S61-135740 A † | 6/1986 |
| JP | 63 195551 | 12/1988 |
| JP | 9 40444 | 2/1997 |
| JP | 9-314645 | 12/1997 |
| JP | H09-314645 A † | 12/1997 |
| JP | 2000 178044 | 6/2000 |
| JP | 2001 19499 | 1/2001 |
| JP | 2008 156135 | 7/2008 |
| JP | 2010 215493 | 9/2010 |
| JP | 2010 265161 | 11/2010 |

OTHER PUBLICATIONS

International Search Report Issued Jul. 3, 2012 in PCT/JP12/58406 Filed Mar. 29, 2011.

\* cited by examiner
† cited by third party

POLYVINYL ACETAL RESIN FILM AND MULTILAYER STRUCTURE ARTICLES USING THE SAME

TECHNICAL FIELD

The present invention relates to a polyvinyl acetal resin film that shrinks within the appropriate range at the time of heat lamination, and a method for producing the same; and a multilayer structure articles using the film for at least one layer thereof, an encapsulant for solar cells using the film, a solar cell module using the film, an interlayer film for laminated glass using the film, and a laminated glass.

BACKGROUND ART

For architectural laminated glass, automobile windshield, and the like, generally, a multilayer structure articles having a function, that is, pieces of glass are not scattered when the glass is broken, or people, things, and the like do not rush outside penetrating the glass, which is obtained by arranging a film of polyvinyl acetal resin or the like between two inorganic glasses or organic glasses, and then by performing heating and pressure laminate, is used. Further, as to a solar cell module, it has been performed widely that solar cells (crystalline silicon, thin-film silicon, a metal compound thin film, an organic thin film, and a transparent or opaque electrode layer) are arranged between two glasses or weather-resistant plastic films, and a film of polyvinyl acetal resin and the like is arranged between the cells and the glasses on both sides of the cells, and then for which the film is melted to flow to fill up the gap by heating and crimping the entire resultant. However, when such a multilayer structure articles is produced, air bubbles are generated at the edge portion of the polyvinyl acetal resin layer, or unfilled portion of the polyvinyl acetal resin is generated in the structure, as a result, there may become a defective product.

In order to solve these problems, for example, as disclosed in Patent Literature 1, Patent Literature 2, and Patent Literature 3, as to a filler, there have been proposed a method in which the degassing is made easier by providing emboss on the surface, or by optimizing the creeping property, and the like. Further, in Patent Literature 4, there have been proposed a method in which the shape of the edge portion of glass is defined to make the degassing easier, and not to generate the unfilled portion.

Furthermore, as to the heat shrinkage of a sheet or film containing polyvinyl acetal resin, there are descriptions in Patent Literature 5, Patent Literature 6, and Patent Literature 7. Specifically, in Patent Literature 5, there are descriptions that as an attempt to impart degassing performance at the time of lamination, and impact resistance of laminated glass, an interlayer film for laminated glass in which the difference in shrinkage in respective portions is within ±1% is used, and further that the shrinkage when the interlayer film is heated at 54° C. for 10 minutes is about 2%. In Patent Literature 6, there are descriptions that as an attempt to obtain a specific film that is particularly useful as an intermediate layer for laminated glass in curved windshield, a film shape object of polyvinyl acetal resin showing a positive rate of change in the shrinkage is used, and further that the shrinkage when the film is heated at 71° C. for 30 minutes is about 5 to 13%. In Patent Literature 7, there are descriptions that as an attempt to reduce the variations in thickness of sheet due to strain, or to reduce the heat shrinkage, an embossed sheet in which emboss having a specific shape is formed is used, and further that the shrinkage when the sheet is heated at 50° C. for 10 minutes is about 2.5%.

CITATION LIST

Patent Literature

Patent Literature 1: JP09-40444A
Patent Literature 2: JP2001-19499A
Patent Literature 3: JP2000-178044A
Patent Literature 4: JP2008-156135A
Patent Literature 5: JP60-021834A
Patent Literature 6: JP48-051964A
Patent Literature 7: JP06-210729A

SUMMARY OF INVENTION

Technical Problem

However, in the methods described in Patent Literature 1, Patent Literature 2, and Patent Literature 3, even if there is an effect to remove the remaining air, measures are not sufficient for the generation of air bubbles or unfilled portion due to the warpage or deformation of the glass edge face, and thus the troubles due to the generation of air bubbles or unfilled portion could not be suppressed or prevented. In the method described in Patent Literature 4, there was a problem that the glass is limited. Further, in the methods described in Patent Literature 5, Patent Literature 6, and Patent Literature 7, there was a problem that in the conditions of such high temperature (about 150° C.) at which lamination with glass is performed, air bubbles generated by the evaporation of the water present in an interlayer film are not sufficiently suppressed.

In recent years, the case in which for the purpose of improving the strength of multilayer structure articles, heat tempered glass is used on one of or both of the sides of each of these all architectural laminated glass, automobile windshield, and solar cell module, is increased, however, as a result of the production process, generally, there is a little waving or warpage in the heat tempered glass. Further, as to architectural laminated glass, and automobile windshield, from the design side, the case in which glasses having a curved surface are bonded together has been increased.

FIG. 1A is a sectional view of an edge portion of a multilayered body before the lamination of heat tempered glass. Further, FIG. 1B is a sectional view of an edge portion of a multilayered body at the time of the generation of defects after the lamination of heat tempered glass. When the heat tempered glass having waving or warpage is used, or the glass having a curved surface is used, as shown in FIG. 1A, there may be a case in which the distance of heat tempered glass 1 and glass 2 becomes wider at the edge portion rather than the center portion. In this condition, when heat lamination is performed using a polyvinyl acetal resin film 3 in which the thickness is relatively uniformized, the filling amount of polyvinyl acetal resin film 3 is insufficient at the edge portion in which the distance of heat tempered glass 1 and glass 2 is wider, therefore, as shown in FIG. 1B, a phenomenon that a gap (a gap that is vacuum and independent) such as an unfilled portion of polyvinyl acetal resin, that is, air bubble 5, or a space such as a tunnel-shaped space from the edge toward the center portion (tunnel-shaped defect 4) is generated, may be observed. This unfilled portion has not only a problem in appearance, but also a problem as a multilayer structure articles because the moisture entered from the outside at the time of use may be accumulated in the unfilled portion to generate delamination or whitening sometimes.

Further, as to a problem of the defect generated at the edge portion in a multilayer structure articles, even in the case in which the lamination is performed using a flat float glass by a vacuum laminator system or a vacuum bag system, there was a problem of the defect generated. FIG. 2A is a sectional view of a vacuum laminating apparatus immediately before the pressurization at the time of the vacuum lamination, FIG. 2B is a sectional view enlarged the edge face portion of a multilayer structure articles at the time of the pressurization, and FIG. 2C is a sectional view enlarged the edge face portion of a multilayer structure articles at the time of pressure relief after the vacuum lamination. As shown in FIG. 2A, the inside of table of a vacuum laminator 10 and a planar material (retainer film 7) is set as a vacuum space 9, when a body to be laminated 6 in the inside is pressurized by atmospheric pressure 8, the edge portion of a multilayer structure articles is always compressed more strongly than the center portion. As a result, as shown in FIG. 2B, upper surface glass 2*a* at the edge portion of a multilayer structure articles is pushed down lower than the other parts, and the gap between the upper surface glass 2*a* and the lower surface glass 2*b* becomes narrower, a polyvinyl acetal resin film 3 becomes thinner along these glasses 2, and thus the polyvinyl acetal resin is flowed out more outward than the upper and lower glasses 2. Further, when the pressure due to atmospheric pressure 8 is relieved after the lamination, as shown in FIG. 2C, the edge portion of upper surface glass 2*a* is back to the original flat state due to the stress, however, as described above, since the edge portion of polyvinyl acetal resin film 3 has become thinner, polyvinyl acetal resin to be filled to the edge portion becomes insufficient relative to the volume of the space that is generated between glasses 2 at the edge portion. As a result, as shown in FIG. 2C, (as in FIG. 1B) air bubbles 5 or tunnel-shaped defect 4 may be generated in polyvinyl acetal resin film 3. Further, FIG. 3A is a view showing a state that is viewed from the upper surface with the top cover removed when two bodies to be laminated are placed, in a vacuum laminator or a vacuum bag system. FIG. 3B is a view showing a state that is viewed from the upper surface with the top cover removed when four bodies to be laminated are placed. In a vacuum laminator system and a vacuum bag system, from the viewpoint of efficiency, 2 to 4 bodies to be laminated 6 are placed at one time on table of a vacuum laminator 10 or in a vacuum bag in many cases. However, in this case, glass present in the side that is the closest to the outer periphery of apparatus or bag (referred to as defect frequently generating part 11) is pressed stronger than the other portions, the edge portion of glass tends to be pressed in a state where the edge portion is bent (FIG. 3A and FIG. 3B), and thus the defect can be easily generated at defect frequently generating part 11.

Therefore, an object of the present invention is to provide a polyvinyl acetal resin film that is used as one layer of a multilayer structure articles such as architectural laminated glass, automobile windshield, and solar cell module, which can prevent the intrusion of bubbles into a polyvinyl acetal layer at the edge portion in a multilayer structure articles and the generation of unfilled portions of polyvinyl acetal layer, a method for producing the same; and a multilayer structure articles obtained with the use of the film.

Solution to Problem

In order to achieve the above object, the inventors examined these measures, as a result, found that by the heat lamination using a film in which the heat shrinkage of at least one direction of the film, one side in particular, is controlled in the specific range, the generation of air bubbles at the edge portion of the multilayer structure articles, and of unfilled portion of polyvinyl acetal resin is significantly improved, and the inventors further intensively studied, as a result, the present invention has been completed.

The present invention relates to a polyvinyl acetal resin film, having a thickness distribution in the width direction of 10% or less, and a volatile matter content of 1.0 mass % or less, in which as to a portion of 5% of the total width of the film inside from each of both edges in the width direction, when each portion is heated at 150° C. for 30 minutes, a larger value of heat shrinkage in the flow direction that is parallel to the film and perpendicular to the width direction is referred to as heat shrinkage MD1, and the other value is referred to as heat shrinkage MD2, and when central portion in the width direction of the film is heated at 150° C. for 30 minutes, heat shrinkage in the flow direction that is parallel to the film and perpendicular to the width direction is referred to as heat shrinkage MD3, all the heat shrinkage MD1, the heat shrinkage MD2, and the heat shrinkage MD3 are 3 to 20%.

Further, in the present invention, as to a portion of 5% of the total width inside from each of both edges in the width direction, when each portion is heated at 150° C. for 30 minutes, each heat shrinkage in the width direction that is parallel to the film and perpendicular to the flow direction is referred to as heat shrinkage TD1 or heat shrinkage TD2, both of the heat shrinkage TD1 and heat shrinkage TD2 are 0% or less, an absolute value of each heat shrinkage in the width direction is preferably a value of an absolute value of the heat shrinkage in the flow direction or less at the same portion.

In addition, the present invention preferably satisfies the following formulae (I) and (II).

[Mathematical Formula 1]

$$\text{Heat shrinkage } MD1/\text{heat shrinkage } MD2 \geq 1.7 \quad \text{(I)}$$

$$0.7 \leq \text{Heat shrinkage } MD2/\text{heat shrinkage } MD3 \leq 1.4 \quad \text{(II)}$$

A film of the present invention is preferably used for heat lamination. Further, a film of the present invention preferably has emboss or continuous recesses, having a height difference of 20 μm or more, on the surface of the film.

Further, a film of the present invention preferably contains 1 to 1000 ppm of organic acid salt of a metal having a valance of 2 or more in terms of metal atom relative to a polyvinyl acetal resin, in the point that more stable heat shrinkage can be achieved. More preferably, the film contains 10 ppm or more.

In addition, the present invention relates to a method for producing a polyvinyl acetal resin film, in which when the polyvinyl acetal resin film is formed using an extruder, a temperature of a polyvinyl acetal resin is 150 to 250° C. at the time of extruding the polyvinyl acetal resin from a die, a distance between die lips and a contact point of the film in a roll which is positioned closest to the die lips is 5 to 15 cm, and a film-forming rate is 0.4 to 20 m/min.

Further, the present invention relates to a multilayer structure articles obtained by superimposing and multilayering the polyvinyl acetal resin film, and a glass or a durable film. In such a multilayer structure articles, the polyvinyl acetal resin film is preferably included on at least one surface of the multilayer structure articles.

The present invention relates to a solar cell module using the polyvinyl acetal resin film as an encapsulant, or a laminated glass using the polyvinyl acetal resin film as an interlayer film.

Advantageous Effects on Invention

According to the present invention, a multilayer structure articles of architectural laminated glass, automobile windshield, solar cell module, and the like, which can prevent the intrusion of bubbles in the polyvinyl acetal resin at the edge portion of the multilayer structure articles, and the generation of unfilled portions of the polyvinyl acetal resin by using a polyvinyl acetal resin film that shrinks within the appropriate range at the time of heat lamination; and which is excellent in appearance and durability, can be obtained.

DESCRIPTION OF EMBODIMENTS

Figure 1A:
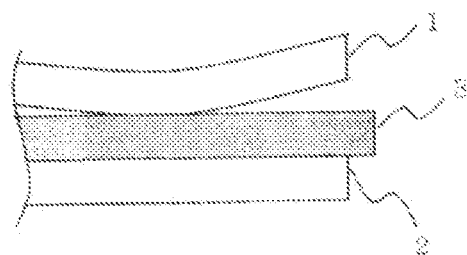
FIGS. 1A and 1B are one example of the sectional views at the edge portions of a multilayer structure articles according to an embodiment of the present invention.
Figure 1B:
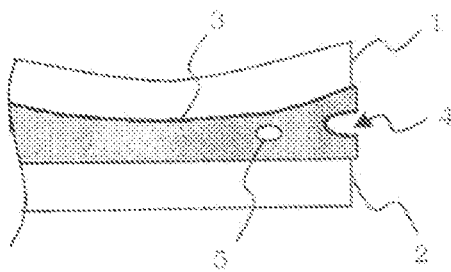
Figure 2A:
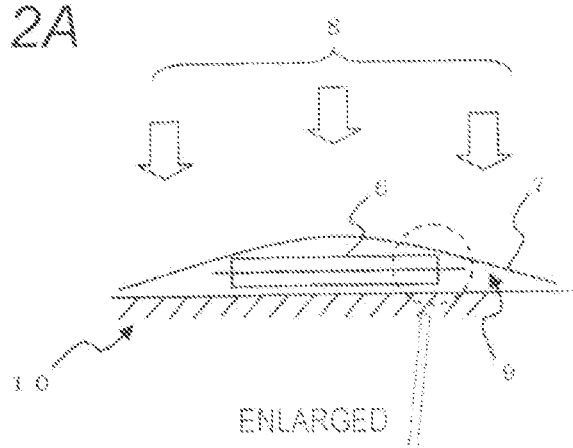
FIGS. 2A, 2B and 2C are one example of the sectional views of a vacuum laminating apparatus and a multilayer structure articles according to an embodiment of the present invention.
Figure 2B:
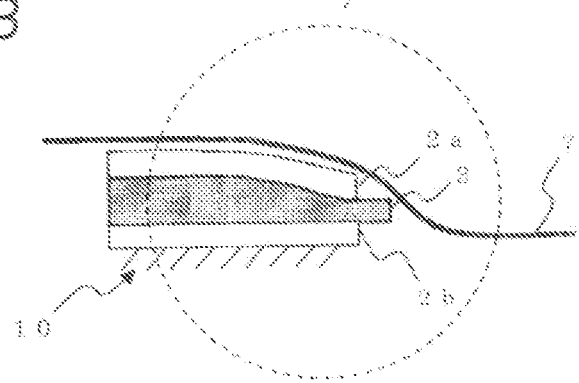
Figure 2C:
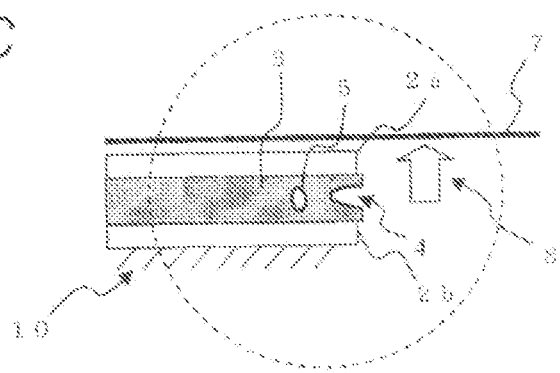

The film of the present invention is a polyvinyl acetal resin film, having a thickness distribution in the width direction of 10% or less, and a volatile matter content of 1.0 mass % or less, in which as to a portion of 5% of the total width inside from each of both edges in the width direction, when each portion is heated at 150° C. for 30 minutes, a larger value of heat shrinkage in the flow direction that is parallel to the film and perpendicular to the width direction is referred to as heat shrinkage MD1, and the other value is referred to as heat shrinkage MD2, and when central portion in the width direction of the film is heated at 150° C. for 30 minutes, heat shrinkage in the flow direction that is parallel to the film and perpendicular to the width direction is referred to as heat shrinkage MD3, all the heat shrinkage MD1, the heat shrinkage MD2, and the heat shrinkage MD3 are 3 to 20%.

The polyvinyl acetal resin used for a polyvinyl acetal resin film of the present invention is obtained by acetalization of polyvinyl alcohol resin with aldehydes, for example, is produced by a method described below, but is not limited to the method.

The polyvinyl alcohol resin used for a material of polyvinyl acetal resin can be obtained, for example, by polymerization of vinyl ester monomers, and saponification of the obtained polymer. As a method for polymerizing vinyl ester monomers, a conventionally known method such as a solution polymerization method, a bulk polymerization method, a suspension polymerization method, and an emulsion polymerization method can be applied. As a polymerization initiator, depending on the polymerization method, an azo initiator, a peroxide initiator, a redox initiator, and the like are appropriately selected. As a saponification reaction, alcoholysis, hydrolysis, and the like using a conventionally known alkali catalyst or acid catalyst can be applied, among them a saponification reaction using methanol as a solvent, and caustic soda (NaOH) as a catalyst is simple and most preferred. As a degree of saponification of polyvinyl alcohol resin used for the present invention, the degree is not particularly limited, but preferably 95 mol % or more, more preferably 98% or more, and particularly preferably 99% or more in order to reduce the amount of carboxylic acid generated by the decomposition.

Examples of the vinyl ester monomer include vinyl formate, vinyl acetate, vinyl propionate, vinyl butyrate, vinyl isobutyrate, vinyl pivalate, vinyl versatate, vinyl caproate, vinyl caprylate, vinyl laurate, vinyl palmitate, vinyl stearate, vinyl oleate, and vinyl benzoate, and among them vinyl acetate is particularly preferred.

Further, when the vinyl ester monomers are polymerized, within the range that does not impair the effects of the present invention, the vinyl ester monomers can be copolymerized with other monomers. Examples of the other monomer include α-olefin such as ethylene, propylene, n-butene, and isobutylene; acrylic acid, or a salt thereof; acrylates such as methyl acrylate, ethyl acrylate, n-propyl acrylate, i-propyl acrylate, n-butyl acrylate, i-butyl acrylate, t-butyl acrylate, 2-ethylhexyl acrylate, dodecyl acrylate, and octadecyl acrylate; methacrylic acid, and a salt thereof; methacrylates such as methyl methacrylate, ethyl methacrylate, n-propyl methacrylate, i-propyl methacrylate, n-butyl methacrylate, i-butyl methacrylate, t-butyl methacrylate, 2-ethylhexyl methacrylate, dodecyl methacrylate, and octadecyl methacrylate; acrylamide; an acrylamide derivative such as N-methyl acrylamide, N-ethyl acrylamide, N,N-dimethyl acrylamide, diacetone acrylamide, acrylamide propane sulfonic acid, and a salt thereof, acrylamide propyl dimethylamine, or a salt thereof, or a quaternary salt thereof, and N-methylol acrylamide, and a derivative thereof; methacrylamide; a methacrylamide derivative such as N-methyl methacrylamide, N-ethyl methacrylamide, methacrylamide propanesulfonic acid, and a salt thereof, methacrylamide propyl dimethylamine, or a salt thereof, or a quaternary salt thereof, and N-methylol methacrylamide, or a derivative thereof; vinyl ethers such as methyl vinyl ether, ethyl vinyl ether, n-propyl vinyl ether, i-propyl vinyl ether, n-butyl vinyl ether, i-butyl vinyl ether, t-butyl vinyl ether, dodecyl vinyl ether, and stearyl vinyl ether; nitriles such as acrylonitrile, and methacrylonitrile; vinyl halide such as vinyl chloride, and vinyl fluoride; vinylidene halide such as vinylidene chloride, and vinylidene fluoride; an allyl compound such as allyl acetate, and allyl chloride; maleic acid, and a salt thereof, or an ester thereof, or an anhydride thereof; a vinylsilyl compound such as vinyltrimethoxysilane; and isopropenyl acetate. These monomeric units are used usually at a ratio of less than 20 mol %, and preferably less than 10 mol %, relative to the vinyl ester monomers.

When the vinyl ester monomers are polymerized, the polymerization may be performed in the presence of a thiol compound such as thiolacetic acid, and mercaptopropionic acid, or other chain transfer agents.

As a solvent to produce polyvinyl alcohol resin, the solvent is not particularly limited, but in order to produce industrially in large quantities, water is preferably used, and further polyvinyl alcohol resin is preferably dissolved sufficiently at a high temperature, for example, a temperature of 90° C. or higher in advance before the reaction. Further, the concentration of the aqueous solution is preferably 5 to 40 mass %, more preferably 5 to 20 mass %, and particularly preferably 8 to 15 mass %. When the concentration is excessively low, the productivity is poor, and when the concentration is excessively high, the stirring during the reaction becomes difficult, and further gelation is generated due to the intermolecular hydrogen bridge of polyvinyl alcohol resin, and thus uneven reaction can be generated, therefore, the excessively low or high concentration is not preferable.

Into such the aqueous solution of polyvinyl alcohol resin, aldehydes are added, and then the resultant is reacted under an acidic condition, as a result, a polyvinyl acetal resin can be obtained. Here, as the aldehydes, for example, formaldehyde, acetaldehyde, propionaldehyde, butyraldehyde, hexylaldehyde, benzaldehyde, and the like can be used. The aldehydes are preferably an aldehyde compound having 1 to 12 carbon atoms, and more preferably a saturated alkyl aldehyde compound having 1 to 6 carbon atoms. In particular, a saturated alkyl aldehyde compound having 1 to 4 carbon atoms is preferable, and among them, butyraldehyde is preferable from the viewpoint of mechanical properties of a film when used in applications of solar cells or laminated glass. Further, as the aldehydes, a single aldehyde may be used, or 2 or more kinds of aldehydes may be used in combination. Furthermore, a small amount of polyfunctional aldehydes, aldehydes having other functional groups, or the like may be used in combination in the range of 20 mass % or less of the total aldehydes.

As a catalyst to react the aldehydes with an aqueous solution of polyvinyl alcohol resin, the catalyst is not particularly limited, anyone of organic or inorganic acids may be used, and examples of the catalyst include acetic acid, p-toluenesulfonic acid, nitric acid, sulfuric acid, hydrochloric acid, and carbonic acid. Among them, inorganic acids are preferable, in particular, hydrochloric acid, sulfuric acid, and nitric acid are preferable from the viewpoints that a sufficient reaction rate is obtained, and that washing after the reaction is easy. The concentration of acid to be used for the reaction is, although it depends on the kind of acid used, in the case of hydrochloric acid, sulfuric acid, or nitric acid, preferably 0.01 to 5 mol/L, and more preferably 0.1 to 2 mol/L. When the concentration of acid is excessively low, the reaction rate is slow, and thus it takes time to obtain a polyvinyl acetal resin having an intended degree of acetalization and intended physical properties. When the concentration of acid is excessively high, it is difficult to control the reaction, and further a trimer of aldehyde is easily generated.

As a procedure to react the aldehydes with an aqueous solution of polyvinyl alcohol resin, a known method is included, and examples of the method include a method in which the catalyst is added into an aqueous solution of polyvinyl alcohol resin, and then aldehydes are added to the resultant, and a method in which aldehydes are added first, and then an acid catalyst is added. Further, examples of the method also include a method in which aldehyde or an acid catalyst to be added is added by batch addition, consecutive addition, or split addition, and a method in which a mixed solution of an aqueous solution of polyvinyl alcohol, and aldehyde or an acid catalyst is added to a solution containing an acid catalyst or aldehyde.

The reaction temperature is not particularly limited, and preferably 0 to 80° C., however, in order to obtain a film of the present invention, a polyvinyl acetal resin in a porous state, which is easily washed after the reaction, is preferably used, and until the polyvinyl acetal particles are precipitated during the reaction, the reaction is preferably performed at a relatively low temperature of 0 to 40° C., and preferably 5 to 20° C. Subsequently, in order to lead the reaction to completion, the reaction temperature is preferably raised, for example, the reaction is preferably performed at 50 to 80° C., in particular, at 65 to 75° C. from the viewpoint of the productivity.

The particles of polyvinyl acetal resin obtained by these reactions are preferably in a porous state in order to efficiently remove the remaining acid, aldehydes, and the like. In order to obtain the polyvinyl acetal resin in a porous state, it is required to adjust the viscosity of the reaction mixture, the stirring speed, the shape of stirring blade, the shape of reaction vessel, the reaction temperature, the reaction rate, and the addition method of catalyst and aldehydes. For example, when the reaction temperature is excessively high, polyvinyl acetal resin is fused, and thus it becomes difficult to be porous.

As a method for removing the remaining aldehyde and the remaining acid catalyst after the reaction, a known method is included. The polyvinyl acetal resin is decomposed by an acid to generate aldehydes in the presence of water, therefore, it is preferably adjusted so that the alkali titer value can be a positive value. Here, the alkali titer is a value (mL) defined by the amount of 0.01 mol/L hydrochloric acid required for the alkalimetry of 100 g of polyvinyl acetal resin.

That is, the polyvinyl acetal resin obtained by a reaction is neutralized by an alkaline compound, however, in order to obtain a film of the present invention, the aldehydes remained in the resin are preferably removed as much as possible before the alkali neutralization, and a method in which a reaction is led to completion under the condition that the reaction rate of aldehyde increases, a method in which washing is thoroughly performed by water, a water/alcohol mixed solvent, or the like, a method in which aldehyde is chemically processed, and the like are useful. As the alkaline compound used for alkali neutralization, examples of the alkaline compound include a hydroxide of an alkali metal such as sodium hydroxide, and potassium hydroxide, and an amine compound of ammonia, triethylamine, or pyridine, however, from the viewpoint of coloration, a hydroxide of an inorganic metal is preferable, and particularly an alkali metal hydroxide that hardly affects the adhesion to glass is preferable. Further, the alkali titer value of polyvinyl acetal resin after the alkali washing is preferably 0.1 to 30, and more preferably 1 to 20. When the alkali titer value is excessively low, the hydrolysis resistance is lowered, on the contrary, when the alkali titer value is excessively high, the coloration is easily generated at the time of the film production.

The average degree of polymerization of the polyvinyl acetal resin used in the present invention is preferably 800 to 4000, and more preferably 1000 to 3000. Further, the average degree of acetalization (vinyl acetal unit content) of polyvinyl acetal resin, which is measured in accordance with the provisions of JIS K 6728: 1977, is preferably 50 to 90 mol %, more preferably 55 to 88 mol %, and particularly preferably 60 to 85 mol %.

The vinyl alcohol unit content of the polyvinyl acetal resin used in the present invention, which is measured in accordance with the provisions of JIS K 6728: 1977, is preferably 10 to 50 mol %, more preferably 12 to 45 mol %, and furthermore preferably 15 to 40 mol %. When the vinyl alcohol unit content is more than 50 mol %, the hygroscopicity is increased, and thus metallic corrosion by the water that has absorbed, degradation of the insulating, and peeling of polyvinyl acetal resin film from a substrate, may be caused. On the other hand, when the vinyl alcohol unit content is less than 10 mol %, a problem such as decrease in mechanical strength, poor adhesion to a substrate, and the like, at the time of hot pressing may be caused.

The vinyl ester unit content of the polyvinyl acetal resin used in the present invention, which is measured in accordance with the provisions of JIS K 6728: 1977, is preferably 4 mol % or less, more preferably 2 mol % or less, and furthermore preferably 1 mol % or less. When the vinyl acetate unit content exceeds 4 mol %, due to the decomposition by heat or the hydrolysis by water, acetic acid that is a corrosive substance may be generated. Further, due to the formation of olefins by the elimination of acetic acid, the polyvinyl acetal resin may be easily colored. In addition, each value of the degree of acetalization, the vinyl alcohol unit content, and the vinyl ester unit content, is a value relative to each total of the degree of acetalization (vinyl acetal unit content), the vinyl alcohol unit content, and the vinyl ester unit content, respectively.

The amount of the chloride ions, sulfate ions, and nitrate ions derived from acetalization catalyst that are contained in the polyvinyl acetal resin used in the present invention is preferably 100 ppm or less, more preferably 50 ppm or less, and furthermore preferably 20 ppm or less. These strong acid ions cause corrosion of the metal components that are used for a solar cell module, and the like, therefore, the ions are preferably in a small amount.

The polyvinyl acetal resin used in the present invention contains preferably an organic acid salt of a metal having a valence of 2 or more in order to stabilize the heat shrinkage. Examples of the metal having a valence of 2 or more include an alkaline earth metal such as calcium, or magnesium, copper, zinc, aluminum, titanium, zirconium, vanadium, or chromium, and examples of the organic acid include formic acid, acetic acid, citric acid, oxalic acid, or sulfonic acid. Among them, in the point that the effect of stabilizing the heat shrinkage is high, in particular, magnesium acetate is preferable. The content is not particularly limited, as long as the content is within the range in which the intended physical properties can be expressed and other physical properties are not adversely affected, however, the mass concentration of metal atoms is preferably 1 to 1000 ppm, and more preferably 3 to 800 ppm, relative to the polyvinyl acetal resin. When the mass concentration of metal atoms is less than 1 ppm, there is a tendency to be insufficient to stabilize the heat shrinkage, and when the mass concentration exceeds 1000 ppm, other physical properties may be adversely affected.

In the polyvinyl acetal resin used for the film of the present invention, within the range in which a film to be obtained does not impair the effects of the present invention, an additive such as a plasticizer, an antioxidant, an ultraviolet absorber, an adhesion control agent, an anti-blocking agent, a pigment, a dye, and a functional inorganic compound is added as needed.

A plasticizer used for a film of the present invention is not particularly limited, however, examples of the plasticizer include di-(2-butoxyethyl)-adipate (DBEA), di-(2-butoxyethyl)-sebacate (DBES), di-(2-butoxyethyl)-azelate, di-(2-butoxyethyl)-glutarate, di-(2-butoxyethoxyethyl)-adipate (DBEEA), di-(2-butoxyethoxyethyl)-sebacate (DBEES), di-(2-butoxyethoxyethyl)-azelate, di-(2-butoxyethoxyethyl)-glutarate, di-(2-hexoxyethyl)-adipate, di-(2-hexoxyethyl)-sebacate, di-(2-hexoxyethyl)-azelate, di-(2-hexoxyethyl)-glutarate, di-(2-hexoxyethoxyethyl)-adipate, di-(2-hexoxyethoxyethyl)-sebacate, di-(2-hexoxyethoxyethyl)-azelate, di-(2-hexoxyethoxyethyl)-glutarate, di-(2-butoxyethyl)-phthalate, and/or di-(2-butoxyethoxyethyl)-phthalate Among them, a plasticizer in which the sum of the number of carbon atoms and the number of oxygen atoms that constitute the plasticizer molecule is 28 or more is preferable. Among them, particularly preferable ones are triethylene glycol-di(2-ethylhexanoate), tetraethylene glycol-di(2-ethylhexanoate), di-(2-butoxyethoxyethyl)-adipate (DBEEA), and di-(2-butoxyethoxyethyl)-sebacate (DBEES). The addition amount is preferably 15 to 50 parts by mass, and more preferably 20 to 40 parts by mass relative to 100 parts by mass of polyvinyl acetal resin. Further, 2 or more kinds of plasticizers may be used in combination.

In addition, a polyvinyl acetal film of the present invention may contain an antioxidant. Examples of the antioxidant include a phenolic antioxidant, a phosphorus-based antioxidant, and a sulfur-based antioxidant. Among them, a phenolic antioxidant is preferable, and an alkyl-substituted phenolic antioxidant is particularly preferable.

Examples of the phenolic antioxidant include an acrylate compound such as 2-t-butyl-6-(3-t-butyl-2-hydroxy-5-methylbenzyl)-4-methylphenylacrylate, and 2,4-di-t-amyl-6-(1-(3,5-di-t-amyl-2-hydroxyphenyl)ethyl)phenylacrylate; an alkyl-substituted phenolic compound such as 2,6-di-t-butyl-4-methylphenol, 2,6-di-t-butyl-4-ethylphenol, octadecyl-3-(3,5-)di-t-butyl-4-hydroxyphenyl)propionate, 2,2'-methylene-bis(4-methyl-6-t-butylphenol), 4,4'-butylidene-bis(4-methyl-6-t-butylphenol), 4,4'-butylidene-bis(6-t-butyl-m-cresol), 4,4'-thiobis(3-methyl-6-t-butylphenol), bis(3-cyclohexyl-2-hydroxy-5-methylphenyl)methane, 3,9-bis(2-(3-(3-t-butyl-4-hydroxy-5-methylphenyl)propionyloxy)-1,1-dim ethylethyl)-2,4,8,10-tetraoxaspiro[5,5]undecane, 1,1,3-tris(2-methyl-4-hydroxy-5-t-butylphenyl) butane, 1,3,5-trimethyl-2,4,6-tris(3,5-di-t-butyl-4-hydroxybenzyl) benzene, tetrakis(methylene-3-(3',5'-di-t-butyl-4'-hydroxyphenyl)propionate)methane, and triethylene glycol bis(3-(3-t-butyl-4-hydroxy-5-methylphenyl)propionate); and a triazine group-containing phenolic compound such as 6-(4-hydroxy-3,5-di-t-butylanilino)-2,4-bis-octylthio-1,3,5-triazine, 6-(4-hydroxy-3,5-dimethylanilino)-2,4-bis-octylthio-1,3,5-triazine, 6-(4-hydroxy-3-methyl-5-t-butylanilino)-2,4-bis-octylthio-1,3,5-triazine, and 2-octylthio-4,6-bis-(3,5-di-t-butyl-4-oxyanilino)-1,3,5-triazine.

Examples of the phosphorus-based antioxidant include a monophosphite-based compound such as triphenyl phosphite, diphenyl isodecyl phosphite, phenyl diisodecyl phosphite, tris(nonylphenyl)phosphite, tris(dinonylphenyl)phosphite, tris(2-t-butyl-4-methylphenyl)phosphite, tris (cyclohexylphenyl)phosphite, 2,2-methylenebis(4,6-di-t-butylphenyl)octylphosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, and 10-decyloxy-9,10-dihydro-9-oxa-10-phosphaphenanthrene; and a diphosphite-based compound such as 4,4'-butylidene-bis(3-methyl-6-t-butylphenyl-di-tridecyl phosphite), 4,4'-isopropylidene-bis (phenyl-di-alkyl (C12 to C15)phosphite), 4,4'-isopropylidene-bis(diphenyl monoalkyl (C12 to C15) phosphite), 1,1,3-tris(2-methyl-4-di-tridecyl phosphite-5-t-butylphenyl)butane, and tetrakis(2,4-di-t-butylphenyl)-4,4'-biphenylene phosphite. Among them, a monophosphite-based compound is preferable.

Examples of the sulfur-based antioxidant include dilauryl 3,3'-thiodipropionate, distearyl 3,3'-thiodipropionate, lauryl stearyl 3,3'-thiodipropionate, pentaerythritol-tetrakis-(β-lauryl-thiopropionate), and 3,9-bis(2-dodecyl thioethyl)-2,4,8,10-tetraoxaspiro[5,5]undecane.

These antioxidants can be used alone, or in combination of two or more kinds. The addition amount of the antioxidant is in the range of 0.001 to 5 parts by mass, and preferably 0.01 to 1 part by mass relative to 100 parts by mass of polyvinyl acetal resin.

Examples of the ultraviolet inhibitor include a benzotriazole-based ultraviolet absorber such as 2-(5-methyl-2-hydroxyphenyl)benzotriazole, 2-[2-hydroxy-3,5-bis($\alpha,\alpha'$ dimethylbenzyl)phenyl]-2H-benzotriazole, 2-(3,5-di-t-butyl-2-hydroxyphenyl)benzotriazole, 2-(3-t-butyl-5-methyl-2-hydroxyphenyl)-5-chlorobenzotriazole, 2-(3,5-di-t-butyl-5-methyl-2-hydroxyphenyl)-5-chlorobenzotriazole, 2-(3,5-di-t-amyl-2-hydroxyphenyl)benzotriazole, and 2-(2'-hydroxy-5'-t-octylphenyl)benzotriazole; a hindered amine-based ultraviolet absorber such as 2,2,6,6-tetramethyl-4-piperidylbenzoate, bis(2,2,6,6-tetramethyl-4-piperidyl)sebacate, bis(1,2,2,6,6-pentamethyl-4-piperidyl)-2-(3,5-di-t-butyl-4-hydroxybenzyl)-2-n-butylmalonate, and 4-(3-(3,5-di-t-butyl-4-hydroxyphenyl)propionyloxy)-1-(2-(3-(3,5-di-t-buty 1-4-hydroxyphenyl)propionyloxy)ethyl)-2,2,6,6-tetramethylpiperidine; and a benzoate-based ultraviolet absorber such as 2,4-di-t-butylphenyl-3,5-di-t-butyl-4-hydroxybenzoate, and hexadecyl-3,5-di-t-butyl-4-hydroxybenzoate. The addition amount of the ultraviolet absorber is in the range of preferably 10 to 50000 ppm, and more preferably 100 to 10000 ppm based on mass relative to the polyvinyl acetal resin. Further, these ultraviolet absorbers can be used alone, or in combination of two or more kinds.

As the adhesion control agent to be used, for example, the ones described in WO 03/033583 can be used, alkali metal salts and/or alkaline earth metal salts of organic acid are preferably added, and particularly potassium acetate and/or magnesium acetate is preferable. The addition amount of the adhesion control agent is preferably 1 to 1000 ppm, more preferably 3 to 800 ppm, and furthermore preferably 5 to 500 ppm based on the mass of metal atoms relative to the polyvinyl acetal resin. The optimum addition amount of the adhesion control agent varies depending on the additive to be used, and further varies depending on where the module or laminated glass to be obtained is used, however, the adhesive strength of the film to be obtained to glass is generally adjusted to preferably 3 to 10 in a pummel test (described in WO 03/033583A1, and the like), when higher penetration resistance is particularly required, the adhesive strength is adjusted to 3 to 6, and when higher glass scattering prevention is required, adjusted to 7 to 10 preferably. When the higher glass scattering prevention is required, it is also a useful way not to add the adhesion control agent. Further, the adhesion control agent may be the one that is the same as or similar to the shrinkage stabilizer of an organic acid salt of a metal having a valence of 2 or more, or the like to stabilize the heat shrinkage as described above. In this case, the total amount of the same kind of metals is preferably in the range described above.

Examples of the functional inorganic compound to be used include a light reflective material, a light absorbing material, a thermal conductivity improving material, an electrical characteristics improving material, a gas barrier improving material, and a mechanical property improving material.

The composition containing the polyvinyl acetal resin which is added with these additives and appropriately kneaded is subjected to film formation, and to heat lamination. In order to achieve the effect of the present invention, when the film is formed, it is important to adjust the resin temperature at the time of extrusion, the processing after the extrusion, and the like to the specific conditions, for example, a method described below is used, however, the method is not limited to the method described below.

As a method for producing a polyvinyl acetal film of the present invention, a method for producing a film using an extruder is suitably used. The resin temperature at the time of extrusion is preferably 150 to 250° C., and more preferably 180 to 230° C. When the resin temperature is excessively high, the polyvinyl acetal resin is decomposed, and thus the content of volatile substance increases. When the temperature is conversely excessively low, the content of volatile substance also increases. In order to remove the volatile substance efficiently, the volatile substance is preferably removed by reduced pressure from the vent port of the extruder.

It is important for the volatile matter content in a polyvinyl acetal resin film of the present invention to be 1.0 mass % or less, and preferably 0.8 mass % or less, and more preferably 0.6 mass % or less. When the volatile matter content exceeds 1.0 mass %, foaming is caused by the heating of lamination, and further the heat shrinkage becomes larger than the desired physical property, therefore, shift of glasses or solar cells is easily caused.

Only the surface of a polyvinyl acetal film of the present invention is cooled by a refrigerant at a specific temperature immediately after the extrusion, and then the film is preferably wound up. The temperature is preferably 10 to 40° C., and more preferably 20 to 30° C. When the temperature is excessively low, the heat shrinkage becomes excessively low, and when the temperature is conversely excessively high, the heat shrinkage also becomes excessively low.

In order to achieve the film properties required in the present invention, it is one of the useful ways to make effective use of the neck-in part at both ends of the film. Specifically, the position average thickness at the position of 5% of the total width of the film inside from each of both edges before the trimming and cutting is preferably within ±10% of the film average thickness, and more preferably within ±5%. The edge portion of the film is adjusted so as to extend larger than the center portion in the width direction of the film by the extension at the neck-in immediately after the shearing at an outlet of die, the discharge, and the extension after the discharge (the extension in a molten state immediately after the discharge, and the extension in a state after the solidification). Usually, a film has larger thickness in the edge portion, non-uniform gaps are conversely generated, and thus the film is unusable, therefore, the edge portion is trimmed and cut immediately before the winding up, and not included in the product portion in many cases. On the other hand, in a method illustrated in the present specification, in the light of the melting property of polyvinyl acetal resin, at the same time as the extension of film, the shape of die, the gap between die lips, the take-up speed, and the balance of rotational speed ratio between take-up rolls are finely adjusted. As described above, by adjusting the various requirements to closely match the thickness of film edge portions and the thickness of center portion, the trimming and cutting portion of the film can be reduced. For example, in the point that the trimming and cutting portion can be reduced within 15%, and further within 10% from the film edge portion, a film of the present invention is also useful.

As one example of the specific production methods, in the formation of a polyvinyl acetal resin film of the present invention using an extruder, there are some requirements including a temperature of polyvinyl acetal resin is 150 to 250° C. at the time of extrusion of the polyvinyl acetal resin from a die, further a distance between die lips and a contact point of the film in a roll (the first roll) which is positioned closest to the die lips is 5 to 15 cm, and furthermore a film-forming rate is 0.4 to 20 m/min. The distance between die lips and a contact point of a film is preferably 6 to 10 cm, and the film-forming rate is preferably 0.4 to 10 m/min. These requirements affect the physical properties of the polyvinyl acetal resin film to be obtained, respectively. In a multilayer structure articles, in order to obtain a film of the present invention in which an unfilled portion of resin is not generated, all the requirements are preferably satisfied.

As a method for achieving the film properties required in the present invention, in addition to the method described above, a method in which the edge portion is sandwiched by clips, and extended forcibly, the edge portion is thickened, and then extended larger through rolling mill rolls, and the like, can also be used.

As to the measurement of the average thickness, a film is cut out into pieces of 3 cm×3 cm square (precision of 0.5 mm or less) in succession in the width direction (cut out continuously from one edge, and when the other edge has an odd length, the piece with the odd length is cut out in combination with a piece immediately before the piece and measured, and the measurement is proportionally converted to the 3 cm×3 cm area), and each mass of the cut-out test pieces is measured up to the unit of 0.01 g. The same measurement is performed at three points by changing the position in the length direction (MD), and the average value (unit of 0.01 g) of each obtained mass (each mass of the test pieces in the same position in the width direction) is referred to as "position average thickness". Further, all the cutting out of the film is performed by unifying the position in the width direction at the beginning of the cutting out so that the position of each test piece in the width direction can be aligned. Next, an arithmetical average of all the values of the "position average thickness" that are obtained by the measurements repeated three times is referred to as "film average thickness", and the absolute value of ("position average thickness"–"film average thickness")/"film average thickness"×100 is referred to as thickness distribution (%) at each position in the width direction. The thickness distribution of a film of the present invention at all the positions in the width direction is preferably within 10%, and more preferably within 5%. With the thickness distribution being within the range, the generation of the unfilled portion of polyvinyl acetal resin can be suppressed.

Figure 4:
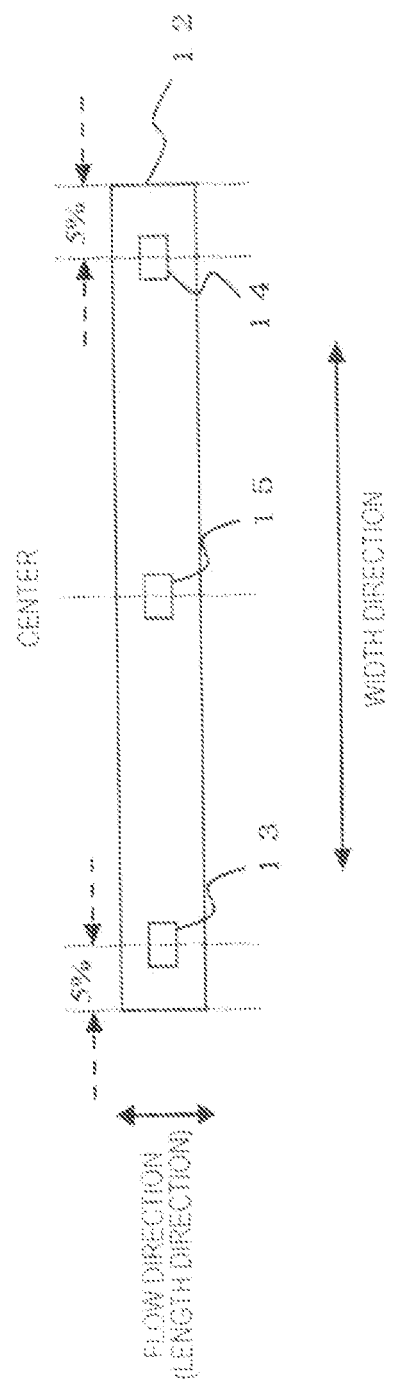
FIG. 4 is one example of the top views of polyvinyl acetal resin film for the measurement of heat shrinkage of a film according to an embodiment of the present invention.

In the present specification, the heat shrinkage of film is measured with the following method. That is, a film is cut out into pieces of 10 cm length over the total width, and the humidity control is performed at 20° C., 30% RH for 2 days by a method of not suppressing the dimensional change of the film (placed on the net rack as it is, and the like). After that, as shown in FIG. 4, a humidity controlled product film 12 is cut out into sheets of the square each side of which is parallel to the flow direction or the width direction to obtain samples A 13 and B 14 so that the positions of 5% of the total width inside from both edges in the width direction of product film 12 can be the centers of samples A 13 and B 14, respectively, and then the cut-out portions are subjected to the measurement of heat shrinkage. Among the heat shrinkages of samples A 13 and B 14 in the flow direction, the larger value of the heat shrinkage is referred to as heat shrinkage MD1, and the smaller value is referred to as heat shrinkage MD2. Further, the product film 12 is cut out into a sheet of the square each side of which is parallel to the flow direction or the width direction to obtain sample C 15 so that the position at the center of the total width of product film 12 can be the center of sample C 15, and then the cut-out portion is subjected to the measurement of heat shrinkage. The measured heat shrinkage of sample C 15 in the flow direction is referred to as heat shrinkage MD3. Samples A 13 to C 15 are cut out so that the positions of 5% of the total width inside from both edges of film or the position at the center of the total width can be overlapped with each center line that bisects each sample. Samples A 13 to C 15 are square shape of 5 cm in the width direction and 5 cm in the length direction. Samples are placed horizontally on a Teflon (registered trademark) sheet that is placed in a hot-air drying machine at 150° C. without being fixed to anywhere, and retained for 30 minutes. At this time, the heat shrinkage is measured in the unit of 0.1 cm in the length in the flow direction and in the length in the width direction before and after the heat treatment, and each of MD and TD is determined by the following Formula (III) and Formula (IV). The same measurement is performed at each position three times, and the average value is referred to as the heat shrinkage at the position. In addition, for example, when the heat shrinkage of sample A 13 in the flow direction is referred to as heat shrinkage MD1, and the heat shrinkage of sample B 14 in the flow direction is referred to as heat shrinkage MD2, the heat shrinkage of sample A 13 in the width direction is defined as TD1, and the heat shrinkage of sample B 14 in the width direction is defined as TD2. That is, heat shrinkage MD1 and heat shrinkage TD1 indicate the heat shrinkage in the flow direction and the heat shrinkage in the width direction of the same sample, respectively, and also heat shrinkage MD2 and heat shrinkage TD2 indicate the heat shrinkage in the flow direction and the heat shrinkage in the width direction of the same sample, respectively. Further, the heat shrinkage of sample C 15 in the flow direction is defined as MD3, and the heat shrinkage in the width direction is defined as TD3. Further, for example, when the total width of a film is 15 cm or more to less than 50 cm, pieces of square with 5 cm in the width direction from each of both edges and with 5 cm in the length direction of a film are cut out for sample A 13 and sample B 14, furthermore, when the total width of a film is less than 15 cm, pieces of square are cut out based on the length in the width direction when the total width is divided into three equal parts.

[Mathematical Formula 2]

Heat shrinkage $MD$ (%)=[the length of $MD$ before the heat treatment–the length of $MD$ after the heat treatment]÷the length of $MD$ before the heat treatment×100  (III)

Heat shrinkage $TD$ (%)=[the length of $TD$ before the heat treatment–the length of $TD$ after the heat treatment]÷the length of $TD$ before the heat treatment×100  (IV)

Heat shrink of a film is performed by the arrangement of a polyvinyl acetal resin layer between two glasses when the lamination is performed in the process described above, however, there may be non-uniform gaps, or non-uniform part during the process, between two glasses, particularly in the edge portion. For the space between glasses, the volume of the polyvinyl acetal resin becomes insufficient, as a result, an unfilled portion of polyvinyl acetal resin is generated. It is an object of the present invention to improve the problem by the resin content filled by heat shrink. As to the heat shrinkage, all the heat shrinkage MD1, heat shrinkage MD2, and heat shrinkage MD3 are in the range of 3 to 20%, preferably 3.5 to 18%, and more preferably 4 to 15%. When the heat shrinkage in the flow direction is less than 3%, the filling amount of polyvinyl acetal resin between glasses becomes insufficient, therefore, the heat shrinkage is inadequate to prevent the generation of the unfilled portion, and when the heat shrinkage exceeds 20%, the film shrinks excessively largely, shift of two glasses, or shift of the solar cells in which the polyvinyl acetal resin layer is arranged is caused.

In a polyvinyl acetal resin film of the present invention, it is the most important thing that the heat shrinkage in the flow direction (MD direction) is in the range of 3 to 20%, however, also the heat shrinkage in the width direction (TD direction) is 0% or less (that is, expansion), and the absolute value of heat shrinkage in the TD direction is preferably less than the value of the heat shrinkage in the MD direction in the same sample. The heat shrinkage in the TD direction is more preferably −10.0 to 0.1%, and the absolute value is less than the value of the heat shrinkage in the MD direction in the same sample. When there is a shrink in both directions, the filling amount of resin is excessively large in the four corners of multilayer structure articles, and further the flow becomes complicated, instead, abnormal filling may be easily generated. When the absolute value exceeds the value of heat shrinkage in the MD direction, the total resin amount in the four corners of multilayer structure articles becomes less than the amount before the lamination, therefore, the deficient portion is easily generated.

In a film of the present invention, the heat shrink in either the one of samples A 13 and B 14 is preferably large. Further, in a film of the present invention, the heat shrink ratio of either one of samples A 13 and B 14 that has smaller heat shrink than the other, and sample C 15 is preferably in a specific range. Among them, the case in which the following conditions are satisfied is particularly preferable.

[Mathematical Formula 3]

Heat shrinkage $MD1$/heat shrinkage $MD2 \geq 1.7$     (I)

$0.7 \leq$ Heat shrinkage $MD2$/heat shrinkage $MD3 \leq 1.4$     (II)

As is described above, at the time of lamination, the apparatus is used to perform the lamination by setting the multiple bodies to be laminated in many cases, and a gap is easily generated in one side particularly, therefore, it is preferable that only the film of this edge portion is largely shrunk and the heat shrinkage of the other portions is slightly lower in consideration of the balance of the size of the gap at each side. That is, a method in which a portion in which the heat shrinkage in the flow direction is large is arranged in the portion in which a gap is most easily opened, to perform lamination, is preferable. The ratio of heat shrinkage MD1/heat shrinkage MD2 is more preferably 2.0 or more. Further, the upper limit of the ratio of heat shrinkage MD1/heat shrinkage MD2 is not particularly limited, however, from the viewpoint of the handling in the production, preferably 4.0 or less, more preferably 3.0 or less, and particularly preferably 2.5 or less. The ratio of heat shrinkage MD2/heat shrinkage MD3 is more preferably 0.8 or more, and more preferably 1.2 or less.

Melt index in the present specification is an average value of the values (g/10 min) that are obtained by the measurement of the film itself in a sufficiently finely-cut state, repeated five times at a barrel set temperature of 150° C. with a weight load of 2.16 kg, in accordance with JIS K 7210. The melt index of a film of the present invention is preferably in the range of 0.05 to 5 g/10 min, and more preferably 0.08 to 3 g/10 min. When the melt index is less than 0.05 g/10 min, at the time of lamination, the resin is poorly flowed, and thus is not flowed into the gap portion. When the melt index exceeds 5 g/10 min, by a pressure at the time of lamination, the resin is flowed out, and thus the case in which a deficient portion is generated is increased.

The thickness of a film consisting of the polyvinyl acetal resin used for a solar cell module of the present invention is not particularly limited, but preferably 0.38 mm to 2.28 mm. In the case in which the thickness is thinner than 0.38 mm, a space around solar cells or functional units cannot be sufficiently filled, and in the case in which the thickness is thicker than 2.28 mm, the cost of the film itself is high, and further the cycle time of lamination process becomes longer, therefore, these cases are not preferable. Further, the thickness of a film consisting of the polyvinyl acetal resin used for architectural laminated glass, and automotive safety glass is not particularly limited, but preferably 0.30 mm to 2.28 mm. In the case in which the thickness is thinner than 0.30 mm, the penetration resistance performance of architectural laminated glass, and automotive safety glass cannot be satisfied, and in the case in which the thickness is thicker than 2.28 mm, the shift of glass and the like are generated when the polyvinyl acetal resin is softened at a high temperature, therefore, these cases are not preferable.

The width of a film of the present invention is not particularly limited, but preferably 300 mm to 3300 mm, and further is preferably a width (and a length after the cutting out) in the range of 0 to +10 mm of the size of laminated body from the viewpoint of preventing a defect and reducing the film loss. When the width is excessively narrower than the size of the laminated body, the deficient portion in the edge face becomes large, or multiple sheets are required for the use, and thus the usability is bad. Further, as to an inorganic glass, at present, the maximum width is generally 3200 mm, and thus a film of 3300 mm width is not required, and further the handling is inconvenient. A winding-up method and the like are not particularly limited either, but there are examples that the film is wound up to a plastic core or metal core having any diameter or wall thickness, or cut into pieces with a size to be used and then the pieces are superimposed and enclosed into a bag. In any cases, by the packaging of a film with high moisture-proof degree in order to prevent the moisture absorption into the film, the requirement of drying again at the time of use can be eliminated. Further, for the purpose of preventing the blocking between films, a film of polyethylene and the like may be inserted between films.

As to the storage and transportation, there is no particular limitation as long as the object of the present invention is not impaired, but from the viewpoint of the stabilization of heat shrinkage, the moisture-proof property, and the anti-blocking property, the temperature is preferably 20° C. or lower, and more preferably 5° C. or lower.

A film of the present invention preferably has emboss or continuous recesses having a height difference of 20 μm or more on a surface of the film, in order to increase the deaeration during the lamination process. That is, the difference between the thickest portion and the thinnest portion of a film is preferably 20 μm or more, and more preferably 40 to 150 μm. As a method for providing convexoconcave, a conventionally known method can be used, examples of the conventionally known method include a method of providing a melt fracture structure by adjusting the extrusion conditions, and a method of imparting an embossed structure to an extruded film. As to the shape and depth of the emboss, there is no particular limitation as long as the object of the present invention is not impaired, but there is an example of configurations, that is, projections in a pyramidal shape with a base of 1 mm and a height of 0.1 mm are provided without gaps, and the like. As to the method of imparting the emboss is not particularly limited, but there can be an example of a method of imparting the emboss to a film by passing a film between a metal roll and a hard rubber, in which a pattern of the emboss has been imparted on the surface of the metal roll, and the surface has been heated while taking care of the temperature, the press pressure, and the like so that the heat shrinkage can be in a range.

A polyvinyl acetal resin film of the present invention may be multilayered in the range in which the physical properties and the object are not impaired. As to a multilayer film, 2 layers (A/B type) or 2 kinds 3 layers (A/B/A type) consisting of 2 kinds of polyvinyl acetal resin compositions, 2 layers (A/B type) or 2 kinds 3 layers (A/B/A type) consisting of one kind of polyvinyl acetal resin composition and another kind of resin composition, or a combination of many kinds that is 2 or more kinds of resin compositions (A/B/C/A, A/B/C/B/A, and the like) can be used, and a multilayer film in which any one of the layers is added with a functional material can also be used. Among them, from the viewpoint of the adhesion between a polyvinyl acetal resin film of the present invention, and a glass or the like, a film of the present invention is preferably included on at least one surface of a multilayer structure articles. In addition, these multilayer films can be used by a device of a constitution in which when a laminated glass is prepared by the arrangement of a light colored layer (A/B (colored)/A) only in the portion of the edge, a light colored portion is provided in the edge of the upper portion, and thus the direct incidence of sunlight from the upper portion is reduced, as a result, an anti-glare effect is provided, and the like, other than the constitution that is arranged equally in the total direction (entire surface).

A solar cell module of the present invention can have a known structure as a structure of solar cell module, except that a film of the present invention is used in all or part of the fillers.

A type of the solar cells used in the present invention is not particularly limited, but examples of the type include crystal type cells, and thin film type cells; and examples of the crystal type cells include single crystal silicon, and polycrystal silicon, and examples of the thin film type cells include a thin-film silicon type of amorphous silicon, and a laminate of the amorphous silicon, a polycrystalline thin film, and the like, a compound semiconductor type using CIS, CIGS, CdTe, GaAs, and the like, and an organic solar cells type.

In the case of the crystal type cells, a film of the present invention is inserted between a surface transparent substrate such as a glass, and crystal type cells, and/or between crystal type cells, and a back side glass or a back sheet, and then lamination is performed for the resultant above, and thus a solar cell module of the present invention can be obtained. Further, in the case of the thin film type, a so-called super straight type, a film of the present invention is inserted between a surface transparent substrate on which solar cells are mounted, and a back side glass or a back sheet. In the case of a sub-straight type, a film of the present invention is inserted between a surface transparent substrate, and a substrate on which solar cells are mounted. In addition, for these laminated bodies, further a film of the present invention can be used as an adhesion layer for the lamination of a transparent substrate, a back sheet, other reinforcing substrate, and the like.

The back sheet used for a solar cell module of the present invention is not particularly limited, but a back sheet with excellent weather resistance and low moisture permeability is preferably used, and a back sheet in which a polyester film, a fluorine resin film, and a laminate thereof, are laminated, and to which an inorganic compound is laminated, and the like are can be used. In the case in which the back sheet is hard, and not easily deformed, similar problems of edge portion as in the case of glass are caused, however, in a flexible sheet, the problems are relatively hardly caused. However, even in the case in which the sheet is flexible, due to the warpage of glass by heat, the pressure change in the lamination process described above, and the like, fluctuation may be generated in the air gap between a back sheet and a glass, and thus the present invention is effective.

As to the back sheet described above, in the laminated body with a film of the present invention, for example, the peel strength in a peeling test at 180° C. is preferably 5 N/cm or more, more preferably 7 N/cm or more, and furthermore preferably 10 N/cm or more.

The laminated glass of the present invention is a glass made by the lamination of a resin of the present invention arranged between two or more glasses, or a film inserted between two or more glasses. Further, a laminated glass in which a functional unit is provided at a position contacted with a polyvinyl acetal resin film of the present invention inside the laminated glass is particularly useful.

The glass used in the present invention is not particularly limited, but a float glass, a tempered glass, a wire glass, a bending glass, a figured glass, an organic glass, and the like can be used. Further, in the case of a solar cell module, a weather-resistant plastic film can also be used. The thickness of glass is not particularly limited, but preferably 1 to 10 mm, and more preferably 2 to 6 mm. The architectural laminated glass, automotive safety glass, and solar cell module of the present invention are produced by a known method, and in which as a filler, a film of the present invention is used.

In particular, a heat tempered glass is wavy due to the production process, and thus there may be a case in which when two glasses are combined together, the gap in the edge portion is wider than that in the center portion. In this portion, the polyvinyl acetal resin is hardly flowed in, and thus this portion is easily unfilled. In the unfilled portion, air bubbles (vacuum and independent) or a tunnel-shaped defect is easily generated. However, by using a film of the present invention, polyvinyl acetal resin is filled by the shrink, into the portion in which deficient would have been generated, and thus the deficient can be prevented. The range of the heat shrinkage will be described below.

In addition, in the architectural laminated glass, automotive safety glass, and solar cell module of the present invention, a known frame or sealing agent, a junction box, a mount tool and frame, an antireflection film, various facilities utilizing solar heat, a rain gutter structure, and the like can be used in combination.

As a lamination method for obtaining architectural laminated glass, automotive safety glass, and solar cell module of the present invention, a known method can be used, and examples of the known method include a method of using a vacuum laminator apparatus, a method of using a vacuum bag, a method of using a vacuum ring, and a method of using nip rolls. Further, a method of putting a temporary-crimped laminate into an autoclave process after the temporary crimping can be additionally performed.

When a vacuum laminator apparatus is used, for example, by using a known apparatus that is used for a production of solar cells, lamination is performed under a reduced pressure of 1 to 30000 Pa, at a temperature of 100 to 200° C., particularly 130 to 160° C. A method of using a vacuum bag or a vacuum ring is described, for example, in EP1235683B1, for example, lamination is performed under a pressure of about 20000 Pa, at a temperature of 130 to 145° C.

Figure 3A:
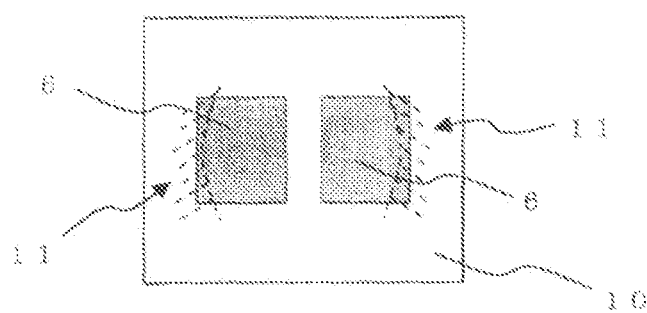
FIGS. 3A and 3B are one example of the top views when a multilayer structure articles according to an embodiment of the present invention is placed in a vacuum laminator.
Figure 3B:
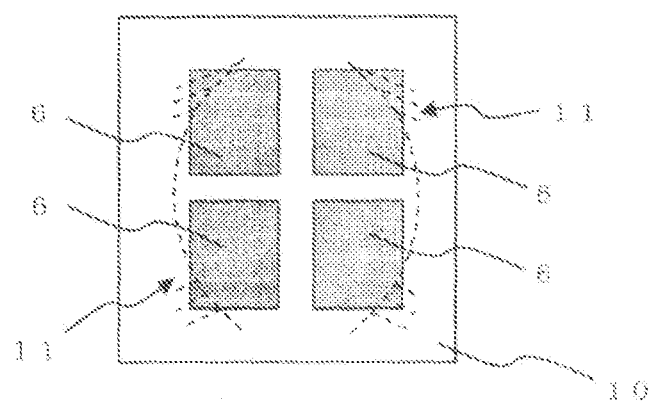

In a lamination method of using a vacuum laminator or a vacuum bag, from the viewpoint of efficiency, 2 to 4 bodies to be laminated are put into a laminator or a bag at once in many cases, however, in this case, glass at the side that is the closest to the outer periphery of the apparatus or the bag is pressed stronger than the other portions, the edge portion of glass tends to be pressed in a state where the edge portion is bent (see FIG. 3A and FIG. 3B). The edge portion pressed such strongly returns to the original shape due to the stress when the pressure is relieved, therefore, a situation in which edge portions are opened is caused. At this time, there may be a case in which a polyvinyl acetal resin layer arranged in the middle is volumetrically insufficient, and thus air bubbles (spaces that are vacuum and independent) and a tunnel-shaped deficient portion that is continuous from an edge portion are generated. However, by using a film of the present invention, polyvinyl acetal is filled by the shrink, into the portion in which air bubbles or deficient would have been generated, and thus the deficient can be prevented. Further, the range of the heat shrinkage will be described below.

In the case of using nip rolls, for example, a method in which the first temporary crimping is performed at a temperature of the flow starting temperature of polyvinyl acetal resin or lower, and then the temporary crimping is performed again under the condition close to the flow starting temperature, can be mentioned. Specifically, for example, a method in which heating to 30 to 70° C. is performed by an infrared heater and the like, and then degasification is performed by a roll, again heating to 50 to 120° C. is performed, and then crimping is performed by a roll to adhere or temporarily adhere to each other, can be mentioned.

An autoclave process that is performed additionally after the temporary crimping is performed, although depending on the thickness and configuration of the solar cell module or laminated glass, for example, under a pressure of about 1 to 1.5 MPa, at a temperature of 130 to 145° C. for about 2 hours.

The architectural laminated glass and automotive safety glass of the present invention can be used as a member for window, front glass, wall, roof, sunroom, soundproof wall, shop window, balcony, railing wall, and the like; a partition glass member for a conference room, and the like; or the like; and further can be used as a household electric appliance.

EXAMPLES

Hereinafter, the present invention is described in more detail by way of Examples. The present invention is not limited to the following Examples. Further, in the following Examples, unless otherwise noted, "%" and "parts" indicates "mass %" and "parts by mass", respectively. The volatile matter content was determined by the heating of 100 g of resin or film at 140° C. for 30 minutes, and by Formula (V). A film was cut out into three pieces of 5 cm square at a position where the following heat shrink is measured, each volatile matter content was measured, and the average value thereof was referred to as a volatile matter content (%) of the film.

[Mathematical Formula 4]

$$\text{Volatile matter content (\%)} = (\text{mass before heating} - \text{mass after heating})/\text{mass before heating} \times 100 \quad (V)$$

The content of vinyl acetate units, the content of vinyl alcohol units, and the average degree of acetalization in a polyvinyl butyral (hereinafter, may be abbreviated as "PVB") resin were measured respectively in accordance with the provisions of JIS K 6728: 1977.

Example 1

Into a 2 m$^3$ reactor equipped with an agitator, 1700 kg of 7.5% aqueous solution of polyvinyl alcohol (hereinafter, may be abbreviated as "PVA".) (PVA-1: degree of polymerization of 1700, and degree of saponification of 99 mol %), 74.6 kg of butyl aldehyde, and 0.13 kg of 2,6-di-t-butyl-4-methylphenol were charged, and the entire solution was cooled to 14° C. To the above, 160.1 L of hydrochloric acid with a concentration of 20 mass % was added to start the butyralization of PVA. The temperature was heated up to 65° C. over 90 minutes from 10 minutes after the addition of hydrochloric acid was completed, and the reaction was further performed for 120 minutes. After that, the temperature was cooled to room temperature, and the precipitated resin was filtered, and washed ten times with 10 volumes (mass ratio) of ion exchanged water relative to the resin. After that, the neutralization was thoroughly performed by using a 0.3 mass % aqueous sodium hydroxide solution. Further, the resultant was washed ten times with 10 volumes (mass ratio) of ion exchanged water relative to the resin, dehydrated, and dried to obtain a PVB resin (PVB-1). In the obtained PVB resin, vinyl acetate units were 0.9 mol %, and vinyl alcohol units were 28.5 mol %. Furthermore, the average degree of acetalization of the PVB resin was 70.6 mol %.

Relative to 100 parts of the PVB-1 obtained here, 30 parts of triethylene glycol di-(2-ethylhexanoate) was premixed, and then by using a same direction twin screw extruder which has a screw of L/D 44 having screw diameter of 30 mm and in which a two tips kneading discs is arranged at the position of 20 to 30 cm from the end, one of the vent ports of the extruder was connected to a vacuum pump, while removing the volatile matter content by a reduced pressure, the kneading extrusion was performed at a discharge rate of 8 kg/hr and a rotational speed of 250 rpm, and the resin temperature was adjusted to 230±5° C., and thus kneaded pellets were produced. Further, a film was formed by using a full flight single screw extruder having a diameter of 40 mm, and a coat hanger die having flexible lips with 60 cm width, by setting the lips opening to 0.8 mm in the center portion, and 0.4 mm in the edge portion. The film thickness was checked before the winding up, and the lips opening was adjusted in the range of ±20%. The distance of the die lips and a contact point of the film to the first roll was set to 7 cm, and the film-forming rate was set to 0.5 m/min. As a result, a film with the width of 112 cm, the thickness of 765 μm at the position of 4 cm from the edge and 770 μm at the opposite side position, and the thickness of 760±30 μm in the center portion was obtained before the trimming and cutting, and the trimming and cutting of the portions of 5 cm from each edge was performed (BF-1). The film of this roll was divided into two parts, left and right parts with the width of 51 cm each by using a single-edged razor at the center of the roll in a slitter again, and then with other winding shafts, the divided films were wound up on each roll, and thus two PVB rolls (BF-2: left as you face in the direction of the winding, and 3: right as you face) were produced. Between them, BF-2 was used to perform the following measurements and evaluations.

The maximum value of the thickness distribution of BF-2 film was 5%, and the volatile matter content was 0.4 mass %. As to the heat shrinkage, heat shrinkage MD1 was 11.5%, heat shrinkage TD1 was −3.1% (expansion), heat shrinkage MD2 was 5.4%, heat shrinkage TD2 was −0.3%, heat shrinkage MD3 was 6.8%, and heat shrinkage TD3 was −0.9%. Further, this film was cut out into pieces of 5 mm square with a pair of scissors, and by using the pieces as samples, the melt index was measured at 150° C. and 2.16 kg, and resulted in 0.23 g/10 min. In addition, the measurement of the thickness distribution was performed by the measurement method described in paragraph 0057 of this specification, and the measurement of heat shrinkage was performed by the measurement method described in paragraph 0058 of this specification. In the following Examples and Comparative Examples, the measurement was performed in the same manner as in the above.

Two glasses of 3.2 mm×50 cm×50 cm of the heat tempered plate glass manufactured by Asahi Glass Co., Ltd. were prepared. When these glasses were superimposed without inserting anything between these glasses, gap of 0.5 mm was observed in one side. On the other hand, from the BF-2 roll obtained above, a film piece of 51 cm×51 cm square was cut out with 51 cm length in the flow direction. This piece was arranged between the two glasses described above so that the piece can be protruded 5 mm from all sides with the arrangement in which the part with a large heat shrinkage in the flow direction comes in a large part of the gap between the glasses, and the arranged resultant was produced to be a laminated glass at a heat plate temperature of 145° C., a degree of vacuum of $10^{-1}$ Pa, and a laminate time of 30 minutes, by using a vacuum laminator manufactured by Nisshinbo Mechatronics Inc. In the laminated glass, there were only two air bubbles with a size of 0.5 mm or less each at the edge portion, and no PVB deficient portion, and thus a product with a good appearance was obtained.

Example 2

A film sample of 51 cm width and 51 cm length was obtained around the center portion of BF-1 in Example 1 (BF-4). The thickness distribution, volatile matter content, and heat shrinkage of this film were measured in the same manner as in Example 1. The maximum value of the thickness distribution was 3%, the volatile matter content was 0.4 mass %, and as to the heat shrinkage, heat shrinkage MD1 was 6.4%, heat shrinkage TD1 was −0.9%, heat shrinkage MD2 was 5.0%, heat shrinkage TD2 was −1.0%, heat shrinkage MD3 was 7.6%, and heat shrinkage TD3 was −0.3%. Further, this film was cut out into pieces of 5 mm square with a pair of scissors, and by using the pieces as samples, the melt index was measured at 150° C. and 2.16 kg, and resulted in 0.24 g/10 min. The laminated glass was produced in the same manner as in Example 1 except that this film was used. Air bubbles with a size of 0.5 mm or less each were observed in five positions in the edge portion, and there was no PVB deficient portion.

Example 3

BF-2 in Example 1 was unwound again, and passed through metal rolls (diameter 40 cm) having a surface temperature of 120° C., subsequently, passed through at a rate of 1 m/min between a metal embossing roll (diameter 40 cm) having a surface temperature of 120° C. and a hard rubber roll on the opposite side thereof, which were arranged and adjusted so that the gap of both rolls can be 0.7 mm, and thus a film roll having an embossed surface with continuous square pyramids of base 1 mm and height 100 μm on the film surface. The width after the embossing was 51.3 cm. The maximum value of the thickness distribution was 3%, the volatile matter content was 0.3 mass %, and as to the heat shrinkage, heat shrinkage MD1 was 10.2%, heat shrinkage TD1 was −2.0%, heat shrinkage MD2 was 4.8%, heat shrinkage TD2 was −0.4%, heat shrinkage MD3 was 5.2%, and heat shrinkage TD3 was −0.9%. Further, this film was cut out into pieces of 5 mm square with a pair of scissors, and by using the pieces as samples, the melt index was measured at 150° C. and 2.16 kg, and resulted in 0.23 g/10 min. This film was cut out into a 51 cm in the length direction, and a sample film of 51.3 cm width×51 cm length was prepared. The center of the heat tempered glass that was used in Example 1, and the center of the sample film were overlapped with each other, and thus a laminated glass was obtained in the same manner as in Example 1 hereinafter. In the laminated glass, there were no air bubbles, and PVB deficient portion was not observed, either.

Example 4

Pellets were obtained in the same manner as in Example 1 except that magnesium acetate was added in an amount of 100 ppm based on mass relative to the PVB resin at the time of the pelletizing; in the same manner, the obtained pellets were formed to obtain a film of 112 cm width (BF-5); further, in the same manner as in Example 1, the film was wound up on two rolls of 51 cm width each in a slitter; and thus the two wound rolls were referred to as BF-6 (left as you face) and BF-7 (right as you face), respectively. The maximum value of the thickness distribution of BF-6 was 6%, the volatile matter content was 0.4 mass %, and as to the heat shrinkage, heat shrinkage MD1 was 13.8%, heat shrinkage TD1 was −4.1%, heat shrinkage MD2 was 6.7%, heat shrinkage TD2 was −0.4%, heat shrinkage MD3 was 7.6%, and heat shrinkage TD3 was −1.1%. Further, this film was cut out into pieces of 5 mm square with a pair of scissors, and by using the pieces as samples, the melt index was measured at 150° C. and 2.16 kg, and resulted in 0.10 g/10 min. Hereinafter, the laminated glass was produced in the same manner as in Example 1. In the laminated glass, air bubbles and PVB deficient portion were not observed, and thus the appearance was good.

Comparative Example 1

In Example 1, the discharge amount was adjusted so that the film-forming rate could be 0.3 m/min, a distance between die lips and a contact point of the film to the first roll was set to 3 cm, a film was formed in the same manner hereinafter, and thus a film of 87 cm width before the trimming and cutting was obtained. Each of both sides was trimmed and cut by 18 cm to obtain a film roll of 51 cm width (BF-8). The maximum value of the thickness distribution of BF-8 was 4%, the volatile matter content was 0.5 mass %, and as to the heat shrinkage, heat shrinkage MD1 was 2.1%, heat shrinkage TD1 was −0.1%, heat shrinkage MD2 was 1.8%, heat shrinkage TD2 was 0.0%, heat shrinkage MD3 was 1.3%, and heat shrinkage TD3 was −0.1%. Further, this film was cut out into pieces of 5 mm square with a pair of scissors, and by using the pieces as samples, the melt index was measured at 150° C. and 2.16 kg, and resulted in 0.24 g/10 min. Hereinafter, the laminated glass was produced in the same manner as in Example 1. In the laminated glass, many air bubbles were observed in the edge portion, and a PVB deficient portion in a tunnel shape extended from the edge portion to the inside was observed in many positions in which gaps had originally observed between the glasses.

Comparative Example 2

In Example 1, a film piece of 51 cm×51 cm square was cut out from BF-2, and retained at 10° C., 70% RH for 3 days. The dimensional change of the film was not observed. The maximum value of the thickness distribution was 5%, the volatile matter content was 1.4 mass %, and as to the heat shrinkage after the humidity control, heat shrinkage MD1 was 26.2%, heat shrinkage TD1 was −5.9%, heat shrinkage MD2 was 8.6%, heat shrinkage TD2 was −0.5%, heat shrinkage MD3 was 10.1%, and heat shrinkage TD3 was −1.4%. Further, this film was cut out into pieces of 5 mm square with a pair of scissors, and by using the pieces as samples, the melt index was measured at 150° C. and 2.16 kg, as a result, foaming was generated and the accurate measurement could not be performed. By using the film above, the laminated glass was produced in the same manner as in Example 1. In the center portion, many air bubbles were observed, and in the edge portion, many air bubbles and a PVB deficient portion in a tunnel shape extended from the edge to the inside were observed over the almost entire periphery.

Comparative Example 3

In Example 1, at the time of the film forming, the discharge amount was adjusted to about 3 times of example 1 so that the film-forming rate could be 2 m/min, a distance between die lips and a contact point of the film to the first roll was set to 20 cm, and thus a film was obtained (BF-9). Hereinafter, in the same manner as in Example 1, two rolls of 51 cm width each were obtained, and a roll in the left as you face in the direction of the winding (BF-10) was used, and evaluated in the same manner as in Example 1 hereinafter. The maximum value of the thickness distribution of this film was 6%, the volatile matter content was 0.4 mass %, and as to the heat shrinkage, heat shrinkage MD1 was 25.1%, heat shrinkage TD1 was −5.8%, heat shrinkage MD2 was 7.9%, heat shrinkage TD2 was −4.3%, heat shrinkage MD3 was 5.3%, and heat shrinkage TD3 was −2.1%. Further, this film was cut out into pieces of 5 mm square with a pair of scissors, and by using the pieces as samples, the melt index was measured at 150° C. and 2.16 kg, and resulted in 0.22 g/10 min. Hereinafter, the laminated glass was produced in the same manner as in Example 1. In the laminated glass, many air bubbles were observed in the edge portion, and a PVB deficient portion in a tunnel shape extended from the edge portion to the inside was observed in many positions in which a gap had originally observed between the glasses.

(Physical Properties of Polyvinyl Acetal Resin Film)

The physical properties of polyvinyl acetal resin film obtained as in the above in Examples 1 to 4, and Comparative Examples 1 to 3 are shown in Table 1.

TABLE 1

| | Thickness distribution (%) | Volatile matter content (mass %) | Heat shrinkage MD1 (%) | Heat shrinkage TD1 (%) | Heat shrinkage MD2 (%) | Heat shrinkage TD2 (%) | Heat shrinkage MD3 (%) | Heat shrinkage TD3 (%) | Heat shrinkage MD1/ Heat shrinkage MD2 | Heat shrinkage MD2/ Heat shrinkage MD3 | Melt index (g/10 min) |
|---|---|---|---|---|---|---|---|---|---|---|---|
| Example 1 | 5 | 0.4 | 11.5 | −3.1 | 5.4 | −0.3 | 6.8 | −0.9 | 2.1 | 0.8 | 0.23 |
| Example 2 | 3 | 0.4 | 6.4 | −0.9 | 5.0 | −1.0 | 7.6 | −0.3 | 1.3 | 0.7 | 0.24 |
| Example 3 | 3 | 0.3 | 10.2 | −2.0 | 4.8 | −0.4 | 5.2 | −0.9 | 2.1 | 0.9 | 0.23 |
| Example 4 | 6 | 0.4 | 13.8 | −4.1 | 6.7 | −0.4 | 7.6 | −1.1 | 2.1 | 0.9 | 0.10 |
| Comparative Example 1 | 4 | 0.5 | 2.1 | −0.1 | 1.8 | 0.0 | 1.3 | −0.1 | 1.2 | 1.4 | 0.24 |
| Comparative Example 2 | 5* | 1.4 | 26.2* | −5.9* | 8.6* | −0.5* | 10.1* | −1.4* | 3.0 | 0.9 | 0.23* |
| Comparative Example 3 | 6 | 0.4 | 25.1 | −5.8 | 7.9 | −4.3 | 5.3 | −2.1 | 3.2 | 1.5 | 0.22 |

*As to the thickness distribution and heat shrinkage of Comparative Example 2, the measurement values after the humidity control were described. The melt index of a film of Comparative Example 2 could not be measured, therefore, a value before the humidity control was described.

INDUSTRIAL APPLICABILITY

The present invention is useful for providing a multilayer structure articles, which can prevent the generation of unfilled portions in the polyvinyl acetal resin layer at the edge portion in the multilayer structure articles by using a film that shrinks within the appropriate range during heat lamination, and which has good appearance and excellent durability.

REFERENCE SIGNS LIST

1 heat tempered glass
2 glass
3 polyvinyl acetal resin film
4 tunnel-shaped defect
5 air bubble
6 laminated
7 retainer film
8 atmospheric pressure
9 vacuum space
10 table of a vacuum laminator (or vacuum bag)
11 defect frequently generating part
12 product film
13 sample A
14 sample B
15 sample C

The invention claimed is:

1. A polyvinyl acetal resin film, comprising:
   a thickness distribution in a width direction of 10% or less,
   wherein heat shrinkages MD1, MD2 and MD3 are independently from 3% to 20% when the polyvinyl acetal resin film is heated at 150° C. for 30 minutes,
   wherein the heat shrinkage MD1 is a heat shrinkage in a flow direction of the polyvinyl acetal resin film at a first edge portion,
   the heat shrinkage MD2 is a heat shrinkage in the flow direction at a second edge portion,
   the heat shrinkage MD3 is a heat shrinkage in the flow direction at a central portion, and
   wherein the heat shrinkage MD1 is larger than the heat shrinkage MD 2, and
   an edge portion is defined by a portion of 5% of a total width of the polyvinyl acetal resin film inside from an edge in the width direction, and
   the flow direction is parallel to the polyvinyl acetal resin film and perpendicular to the width direction.

2. The polyvinyl acetal resin film according to claim 1,
   wherein heat shrinkages TD1 and TD2 are independently 0% or less when the polyvinyl acetal resin film is heated at 150° C. for 30 minutes,
   wherein the heat shrinkage TD1 is a heat shrinkage in the width direction at the first edge portion,
   an absolute value of the heat shrinkage TD1 is same or smaller than an absolute value of heat shrinkage in the flow direction at the first edge portion,
   the heat shrinkage TD2 is a heat shrinkage in the width direction at the second edge portion,
   and an absolute value of the heat shrinkage TD2 is same or smaller than an absolute value of heat shrinkage in the flow direction at the second edge portion.

3. The polyvinyl acetal resin film according to claim 1, wherein formulae (I) and (II) are satisfied:

[Mathematical Formula 1]

$$\text{Heat shrinkage } MD1/\text{heat shrinkage } MD2 \geq 1.7 \quad (I)$$

$$0.7 \leq \text{Heat shrinkage } MD2/\text{heat shrinkage } MD3 \leq 1.4 \quad (II).$$

4. The polyvinyl acetal resin film according to claim 1, wherein the polyvinyl acetal resin film is suitable for heat lamination.

5. The polyvinyl acetal resin film according to claim 1, wherein emboss or continuous recesses having a height difference of 20 μm or more is provided on a surface of the polyvinyl acetal resin film.

6. The polyvinyl acetal resin film according to claim 1, further comprising:
   from 1 to 1000 ppm of organic acid salt of a metal having a valence of 2 or more in terms of metal atom relative to a polyvinyl acetal resin.

7. A method for producing the polyvinyl acetal resin film according to claim 1, the method comprising:
   forming the polyvinyl acetal resin film with an extruder,
   wherein the forming is conducted at a temperature of a polyvinyl acetal resin is from 150 to 250° C. at the time of extruding the polyvinyl acetal resin from a die,
   a distance between die lips and a contact point of the polyvinyl acetal resin film in a roll which is positioned closest to the die lips is from 5 to 15 cm, and
   a film-forming rate is from 0.4 to 20 m/min.

8. A multilayer structure article, comprising:
   the polyvinyl acetal resin film according to claim 1.

9. The multilayer structure article according to claim 8, wherein at least one surface of the multilayer structure articles comprises the polyvinyl acetal resin film.

10. An encapsulant, comprising the polyvinyl acetal resin film according to claim 1.

11. A solar cell module, comprising the encapsulant according to claim 10.

12. An interlayer film, comprising the polyvinyl acetal resin film according to claim 1.

13. A laminated glass, comprising the interlayer film according to claim 12.

14. The polyvinyl acetal resin film according to claim 1, further comprising:
    a volatile matter content of 1.0 mass % or less.

* * * * *